(12) United States Patent
Hsu et al.

(10) Patent No.: US 8,596,869 B2
(45) Date of Patent: Dec. 3, 2013

(54) OPENING-CLOSING GUIDING STRUCTURE OF LONG-STROKE SLIDING COVER

(75) Inventors: An Szu Hsu, New Taipei (TW); Chien Cheng Mai, New Taipei (TW); Way Han Dai, New Taipei (TW)

(73) Assignee: First Dome Corporation, New Taipei (TW)

( * ) Notice: Subject to any disclaimer, the term of this patent is extended or adjusted under 35 U.S.C. 154(b) by 64 days.

(21) Appl. No.: 13/337,548

(22) Filed: Dec. 27, 2011

(65) Prior Publication Data

US 2013/0121626 A1    May 16, 2013

(30) Foreign Application Priority Data

Nov. 15, 2011  (TW) .............................. 100221560 U

(51) Int. Cl.
*F16C 17/00*    (2006.01)

(52) U.S. Cl.
USPC .......................................................... 384/26

(58) Field of Classification Search
USPC ............. 384/7, 18–21, 23, 26, 40–42, 50, 53, 384/54, 57, 58, 59; 455/575.4
See application file for complete search history.

(56) References Cited

U.S. PATENT DOCUMENTS

| 7,084,345 | B1 * | 8/2006 | Chen et al. ..................... 174/545 |
| 7,184,806 | B2 * | 2/2007 | Bae ............................ 455/575.4 |
| 7,433,723 | B2 * | 10/2008 | Bae ............................ 455/575.4 |
| 7,986,511 | B2 * | 7/2011 | Dong et al. ............. 361/679.01 |
| 2007/0032278 | A1 * | 2/2007 | Lee et al. .................... 455/575.4 |
| 2010/0016043 | A1 * | 1/2010 | Kajita et al. ............... 455/575.4 |
| 2010/0091437 | A1 * | 4/2010 | Dong et al. ............. 361/679.01 |
| 2010/0097755 | A1 * | 4/2010 | Shen ........................ 361/679.56 |
| 2011/0244923 | A1 * | 10/2011 | Shen ............................. 455/566 |

FOREIGN PATENT DOCUMENTS

GB          2426139 A    * 11/2006

* cited by examiner

*Primary Examiner* — Phillip A Johnson
(74) *Attorney, Agent, or Firm* — Rosenberg, Klein & Lee

(57) ABSTRACT

An opening-closing guiding structure of a long-stroke sliding cover includes a sliding member, a relative sliding member, first elastic assemblies and second elastic assemblies. The sliding member includes first sliding-guided portions having turned curved portions. The relative sliding member includes a second sliding-guided portion and a third sliding-guided portion, wherein the second sliding-guided portion has a sliding track interlaced with the first sliding-guided portion, and the third sliding-guided portion has a sliding track interlaced with an apex of the turned curved portion of the first sliding-guided portion. The first elastic assembly is slidably connected to the first and second sliding-guided portions. The second elastic assembly is slidably connected to the first and third sliding-guided portions. When a short part of an opening stroke of a sliding cover is performed, a subsequent, long part of the opening stroke of the sliding cover can be automatically operated.

32 Claims, 15 Drawing Sheets

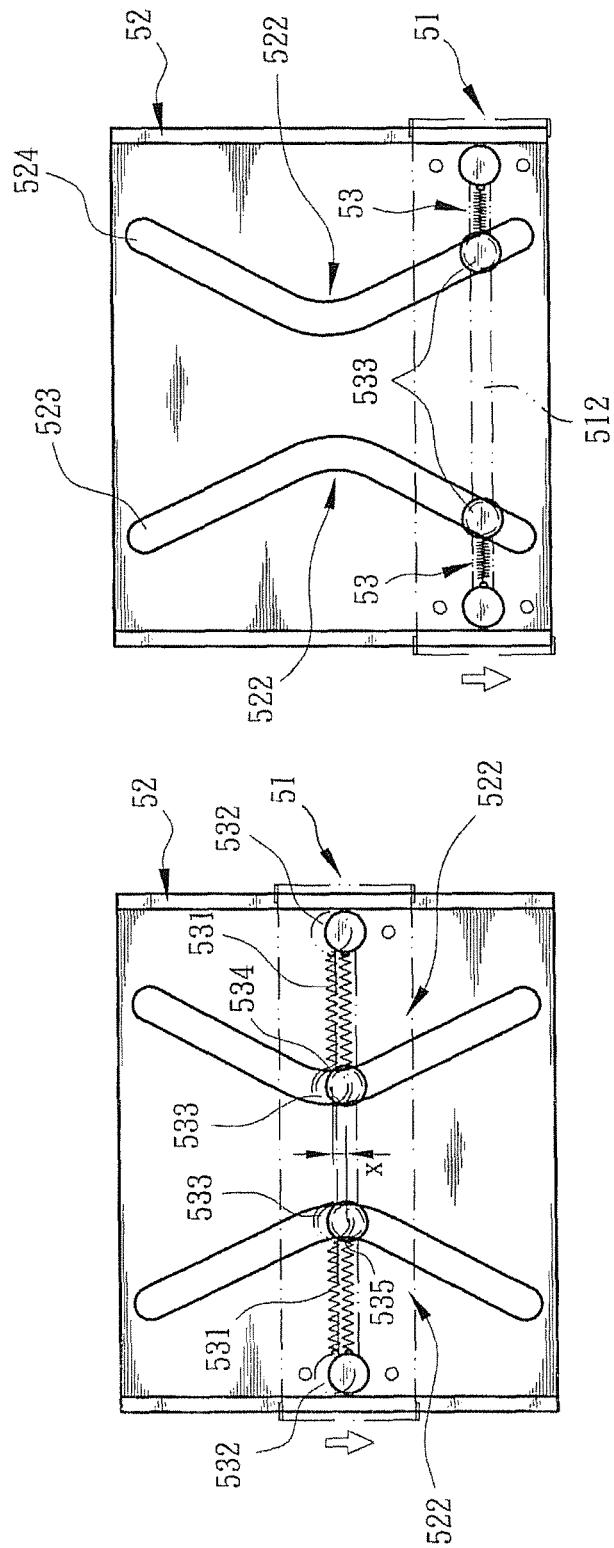

OPENING-CLOSING GUIDING STRUCTURE OF LONG-STROKE SLIDING COVER

BACKGROUND OF THE INVENTION

1. Field of the Invention

The present invention relates to an opening-closing guiding structure of a long-stroke sliding cover, and in particular relates to a sliding-cover guiding structure providing a labor-saving way to open a sliding cover and enabling the rest opening sliding stroke to be automatically performed.

2. Description of the Related Art

Referring to FIGS. 1, 2, 3 and 4, a conventional sliding-cover structure device, capable of being suitable for large-sized electronic products and provided with enforced driving elasticity, mainly includes an upper cover 51 and at least one elastic element 53. The upper cover 51 formed with an U-shaped profile includes a top surface, longitudinal sliding slots 54 disposed on the top surface, and lateral long slots 512. The elastic element 53 includes a fixed end 532 and a free end 531, wherein the fixed end 532 is utilized to be fixed at near the side end of the lateral long slot 512 of the upper cover 51, and the free end 531 connectively installed with a sliding-rolling element 533 which is slidably embedded in the lateral long slot 512 of the upper cover 51 in the direction of the middle section of the lateral long slot 512. The U-shaped upper cover 51 includes two ends respectively extended with folded tabs 510 and two sides formed with concave slots for installing the longitudinal sliding slots 54. The longitudinal sliding slot 54 of the upper cover 51 includes two holes provided at the ends thereof, wherein the two holes are utilized to fixedly receive the fixed ends 532 of the elastic elements 53, respectively.

A bottom plate 52 includes two slide rails 521 disposed on two sides thereof, wherein the two slide rails 521 are embeddable into the longitudinal sliding slots 54 of the upper cover 51. The longitudinal sliding slots 54 of the upper cover 51 are respectively provided with concave slots to be fitted by the two slide rails 521 of the bottom plate 52. Two clamping plate disposed on two ends of the longitudinal sliding slots 54 of the upper cover 51 are utilized to fix on the concave slots of the upper cover 51. The bottom plate 52 further includes two corresponding guide grooves 522 provided with bent-outwardly ends, and the sliding-rolling elements 533 are slidably embedded in the lateral long slots 512 of the upper cover 51 and the guide grooves 522 of the bottom plate 52. At the middle sections of the guide grooves 522 of the bottom plate 52, surpass points 534 and 535 are formed when recurvatures are generated by the guide grooves 522 at different positions, and a cushion portion X is defined by the surpass points 534 and 535. In the operation process, when the sliding-rolling elements 533 are shifted to the cushion portion X in the certain direction, it is necessary that at least the sliding-rolling elements 533 pass through the far surpass point 534 or 535 of the cushion portion X, so that the upper cover 51 is allowed to slidably move in the predetermined direction to automatically complete the sliding stroke in the unfolding or folding process. As a result, in the operation process, it is necessary for a user to move the upper cover 51 for a longer period such that the upper cover 51 can have an automatic sliding effect relative to the bottom plate 52.

BRIEF SUMMARY OF THE INVENTION

In view of this, the present inventor is utilized to overcome the inconveniences and difficulties in the conventional sliding-cover structure device.

The main purpose of the present invention is to provide an opening-closing guiding structure of a long-stroke sliding cover capable of offering the convenience in the opening process. When a short part of an opening stroke of a sliding cover is performed by an initial acting force, a subsequent, long part of the opening stroke of the sliding cover can be automatically operated.

Another purpose of the present invention is to provide an opening-closing guiding structure of a long-stroke sliding cover capable of offering a labor-saving way to move a sliding cover at the beginning of the opening process and generating a larger driving force to act on the sliding cover after an adequate sliding stoke, such that the rest opening sliding stroke of the sliding cover can be automatically performed.

To attain the purpose and effect above, the technique measures of the present invention comprises at least comprising a sliding member and a relative sliding member which are capable of being relatively and reciprocally sliding along a preset sliding track centerline, at least one first elastic assembly and at least one second elastic assembly. One of the sliding member and the relative sliding member comprises a first sliding-guided portion which is disposed along a sliding direction and has an end portion and a turned curved portion disposed near the end portion. The other of the sliding member and the relative sliding member comprises a second sliding-guided portion and a third sliding-guided portion which are capable of being relatively interlaced with the first sliding-guided portion and extended toward a preset guiding direction, the second sliding-guided portion having a sliding track is partially capable of being relatively interlaced with a distal end of the first sliding-guided portion which is near the turned curved portion, and the third sliding-guided portion having a sliding track is at least partially capable of being relatively interlaced with an inflectional apex of the turned curved portion of the first sliding-guided portion. The first elastic assembly comprises one end pivotally disposed near and beside the end portion of the second sliding-guided portion and the other end slidably disposed on an interlaced site of the first sliding-guided portion and the second sliding-guided portion. The second elastic assembly comprises one end pivotally disposed beside the end portion of the third sliding-guided portion and the other end is slidably disposed on an interlaced site of the first sliding-guided portion and the third sliding-guided portion.

According to the above-described structure, the second sliding-guided portion comprises one end portion which is near the first sliding-guided portion is relatively interlaced with the end portion of the first sliding-guided portion which is near the turned curved portion, and the third sliding-guided portion comprises one end portion which is near the first sliding-guided portion is relatively interlaced with the inflectional apex of the turned curved portion of the first sliding-guided portion.

According to the above-described structure, the first sliding-guided portion, the second sliding-guided portion and the third sliding-guided portion are recessed guiding slots, at least one sliding-guided element with low translation friction is disposed at a location where the first elastic assembly is connected to the first sliding-guided portion and the second sliding-guided portion, and at least one sliding-guided element with low translation friction is disposed at a location where the second elastic assembly is connected to the first sliding-guided portion and the third sliding-guided portion.

According to the above-described structure, the sliding-guided element of the first elastic assembly is a roller which is enterable into an interior of one of the first sliding-guided portion and the second sliding-guided portion.

According to the above-described structure, the roller comprises an axial portion protruded with an extended portion which is enterable into an interior of the other of the first sliding-guided portion and the second sliding-guided portion.

According to the above-described structure, the sliding-guided element of the second elastic assembly is a roller which is enterable into an interior of one of the first sliding-guided portion and the third sliding-guided portion.

According to the above-described structure, the roller comprises an axial portion protruded with an extended portion which is enterable into an interior of the other of the first sliding-guided portion and the third sliding-guided portion.

According to the above-described structure, one of the sliding member and the relative sliding member comprises two symmetrically-arranged first sliding-guided portions, and the other of the sliding member and the relative sliding member comprises two symmetrically-arranged second sliding-guided portions and two symmetrically-arranged third sliding-guided portions.

According to the above-described structure, the second sliding-guided portion comprises a Y-shaped extension structure.

According to the above-described structure, the first sliding-guided portion further comprises a relatively short first section and a relatively long second section which are respectively located two sides of the curved portion, and the two end portions of the first sliding-guided portion are slantly disposed in the direction of the sliding track centerline.

According to the above-described structure, each of the sliding member and the relative sliding member comprises at least one side sliding-guided portion extended along the sliding track centerline and a to-be sliding-guided portion slidably connected to the side sliding-guided portion, and the side sliding-guided portion comprises a protruded rail and the to-be sliding-guided portion comprises a recessed slot capable of being engaged to the protruded rail.

According to the above-described structure, one of the sliding member and the relative sliding member is connected to a body of an electrical device, and the other of the sliding member and the relative sliding member is connected to a sliding cover of the electrical device.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 3 is a schematic plan view of FIG. 2, showing the status of the conventional sliding cover when the conventional sliding cover is pushed near to a critical point at in a middle section;

FIG. 4 is a schematic plan view of FIG. 2, showing the status of the conventional sliding cover when the sliding process of the conventional sliding cover is completed;

DETAILED DESCRIPTION OF THE INVENTION

Figure 2:
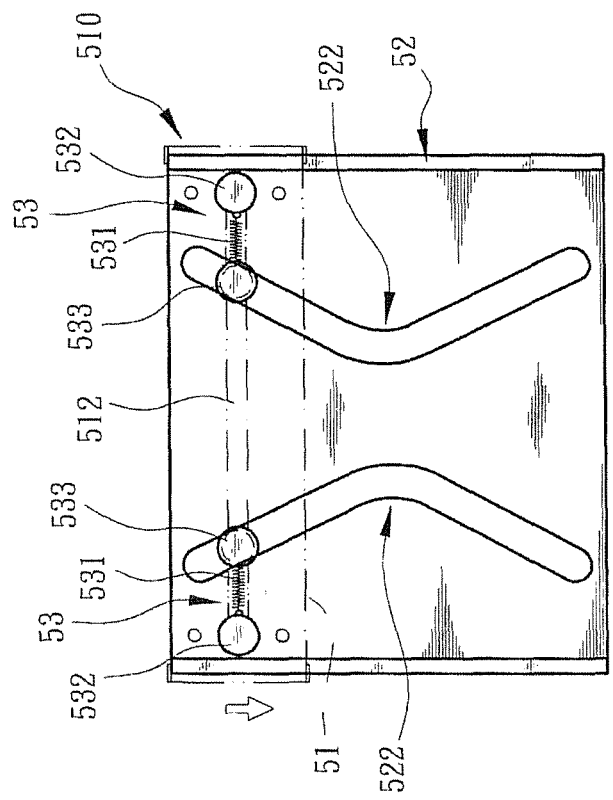
FIG. 2 is a schematic plan view of FIG. 1, showing the status of the conventional sliding cover before being pushed from an initial position.
Figure 1:
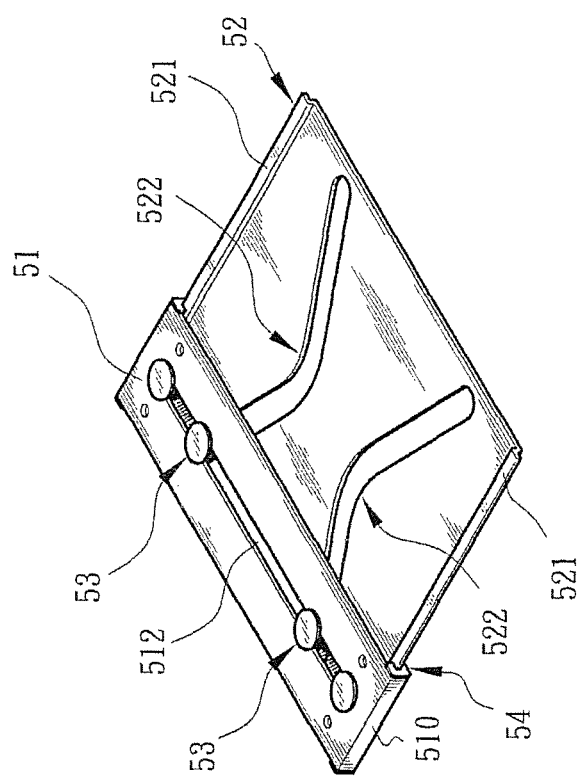
FIG. 1 is a schematic perspective view of a conventional sliding cover.
Figure 5:
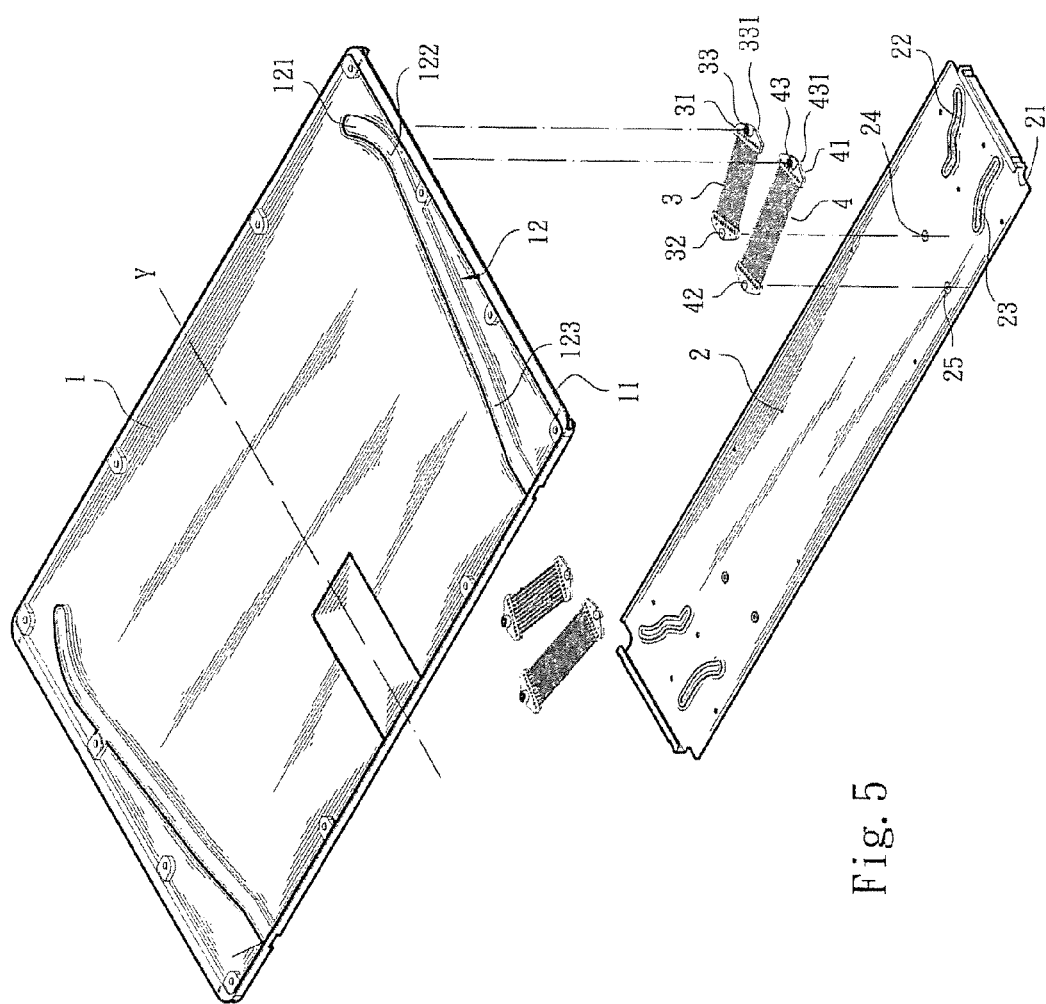
FIG. 5 is a structural exploded view of a first embodiment of the present invention.
Figure 6:
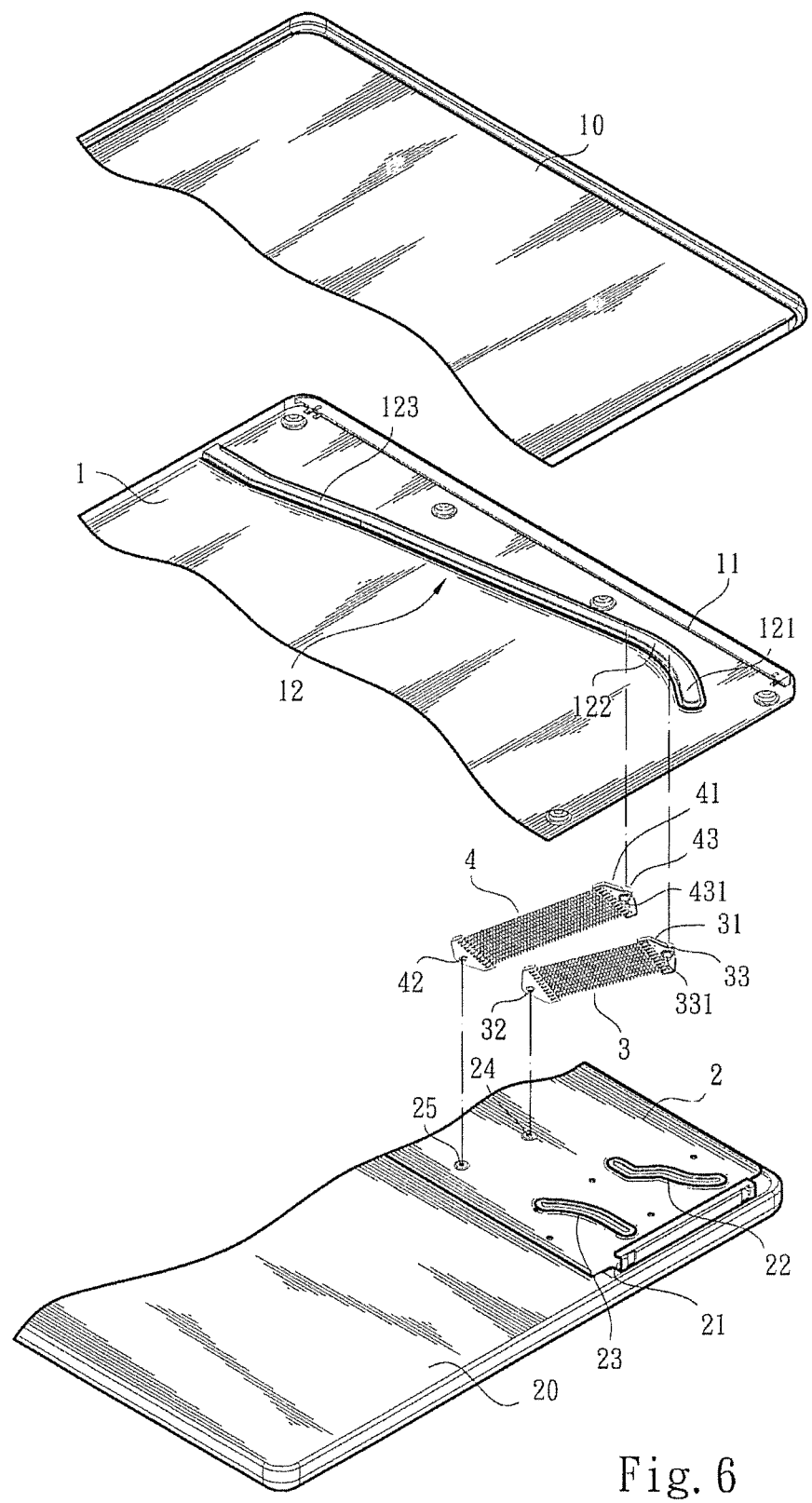
FIG. 6 is a structural exploded view of the first embodiment of the present invention together with a body and a sliding cover of an electrical device.
Figure 7:
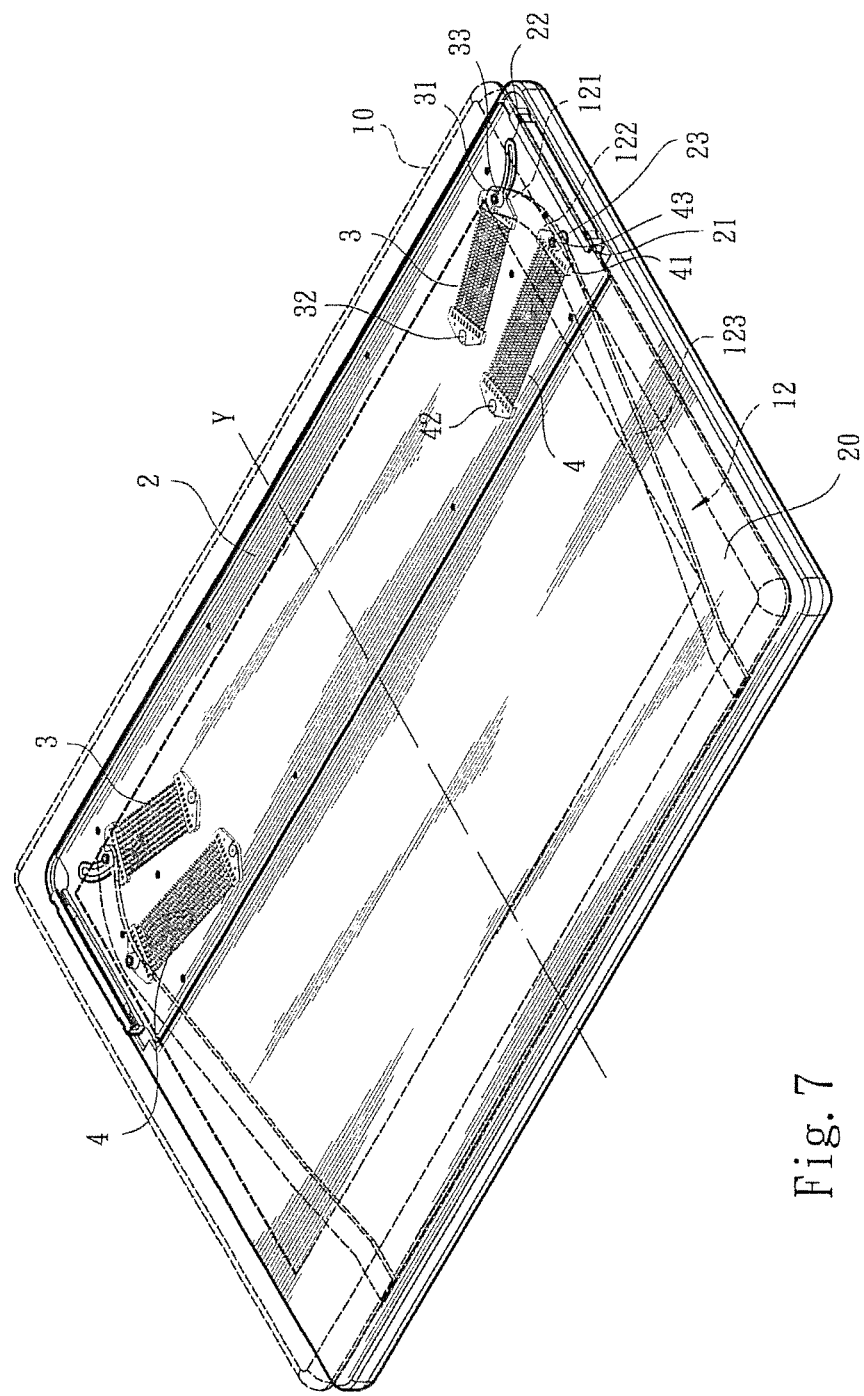
FIG. 7 is an assembled schematic view of the first embodiment of the present invention.

Referring to FIGS. 5, 6 and 7, an opening-closing guiding structure of a long-stroke sliding cover of a first embodiment of the present invention mainly comprises a sliding member 1, a relative sliding member 2, first elastic assemblies 3 and second elastic assemblies 4. The sliding member 1 comprises two side sliding-guided portions 11 parallel to a preset sliding track centerline Y and two first sliding-guided portions 12, wherein each first sliding-guided portion 12 comprises two end portions, a turned curved portion 122 disposed near one of the end portions, and a relatively short first section 121 and a relatively long second section 123 which are respectively located two sides of the curved portion 122. In this embodiment, the side sliding-guided portions 11 can be disposed on two sides of the sliding member 1, the side sliding-guided portions 11 are protruded rails, and the first sliding-guided portions 12 are recessed guiding slots. The two end portions of the first sliding-guided portion 12 are slantly disposed in the direction of the sliding track centerline. The relative sliding member 2 comprises two to-be sliding-guided portions 21 slidably connected to the side sliding-guided portions 11 of the sliding member 1, and a second sliding-guided portion 22 and a third sliding-guided portion 23 which are capable of being relatively and obliquely interlaced with the first sliding-guided portion 12 of the sliding member 1 and extended toward a preset guiding direction, wherein the second sliding-guided portion 22 having a sliding track is partially capable of being relatively interlaced with a distal end of the first sliding-guided portion 12 which is near the turned curved portion 122 of the first sliding-guided portion 12, a pivotal portion 24 is disposed beside one end portion of the second sliding-guided portion 22 which is distant from the first sliding-guided portion 12 of the sliding member 1, the third sliding-guided portion 23 having a sliding track at one end portion thereof is at least partially capable of being relatively interlaced with an inflectional apex of the turned curved portion 122 of the first sliding-guided portion 12, and a pivotal portion 25 is disposed beside one end portion of the third sliding-guided portion 23 which is distant from the first sliding-guided portion 12 of the sliding member 1. In this embodiment, the to-be sliding-guided portions 21 are recessed slots capable of being engaged to the protruded rail, and the second sliding-guided portion 22 and the third sliding-guided portion 23 are recessed slots. Each first elastic assembly 3 comprises two ends respectively defined as a first end 31 and a second end 32, wherein the second end 32 is pivoted to the pivotal portion 24 of the relative sliding member 2 which is disposed near and beside the end portion of the second sliding-guided portion 22, and the first end 31 is slidably disposed on an interlaced site of the first sliding-guided portion 12 and the second sliding-guided portion 22. A sliding-guided element 33 with low translation friction is disposed at the first end 31 of the first elastic assembly 3, wherein the first end 31 of the first elastic assembly 3 is a location where the first elastic assembly 3 is connected to the first sliding-guided portion 12 of the sliding member 1 and the second sliding-guided portion 22 of the relative sliding member 2. In this embodiment, the sliding-guided element 33 of the first elastic assembly 3 is a roller which is enterable into the interior of the first sliding-guided portion 12 of the sliding member 1, and the roller (the sliding-guided element 33) comprises an axial portion protruded with an extended portion 331 which is enterable into the interior of the second sliding-guided portion 22 of the relative sliding member 2, such that the first end 31 of the first elastic assembly 3 can simultaneously move along the first sliding-guided portion 12 of the sliding member 1 and the second sliding-guided portion 22 of the relative sliding member 2. Each second elastic assembly 4 comprises two ends respectively defined as a third end 41 and a fourth end 42, wherein the fourth end 42 is pivoted to the pivotal portion 25 of the relative sliding member 2 which is disposed beside the end portion of the third sliding-guided portion 23, and the third end 41 is slidably disposed on an interlaced site of the first sliding-guided portion 12 and the third sliding-guided portion 23. A sliding-guided element 43 with low translation friction is disposed at the third end 41 of the second elastic assembly 4, wherein the third end 41 of the second elastic assembly 4 is a location where the second elastic assembly 4 is connected to the first sliding-guided portion 12 of the sliding member 1 and the third sliding-guided portion 23 of the relative sliding member 2. In this embodiment, the sliding-guided element 43 of the second elastic assembly 4 is a roller which is enterable into the interior of the first sliding-guided portion 12 of the sliding member 1, and the roller (the sliding-guided element 43) comprises an axial portion protruded with an extended portion 431 which is enterable into the interior of the third sliding-guided portion 23 of the relative sliding member 2, such that the third end 41 of the second elastic assembly 4 can simultaneously move along the first sliding-guided portion 12 of the sliding member 1 and the third sliding-guided portion 23 of the relative sliding member 2.

In the actual application, the relative sliding member 2 (or the sliding member 1) is connected to a body 20 of an electrical device, and the sliding member 1 (or the relative sliding member 2) is connected to a sliding cover 10 of the electrical device.

Figure 8:
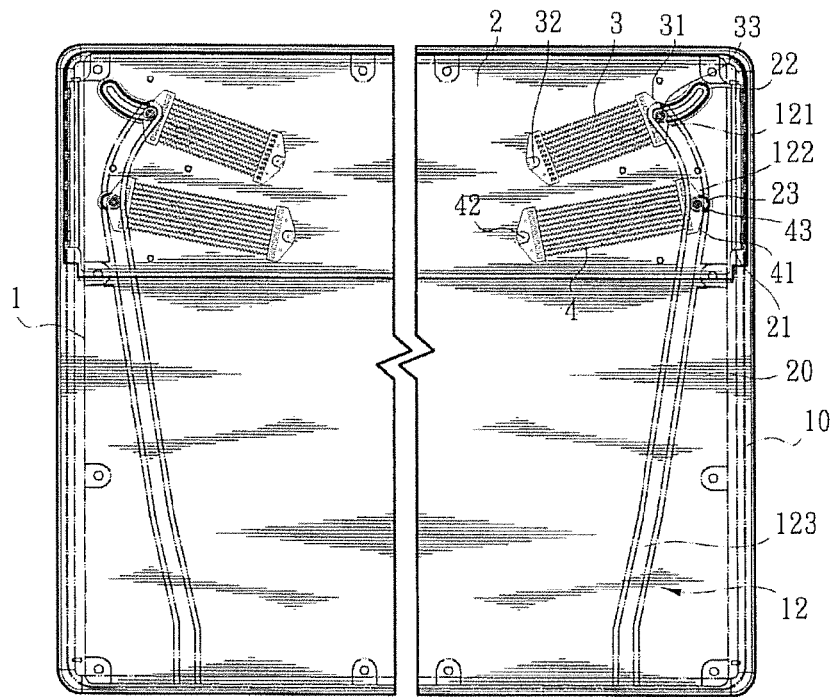
FIG. 8 is a schematic view showing the sliding cover of the first embodiment of the present invention in an opening process.
Figure 9:
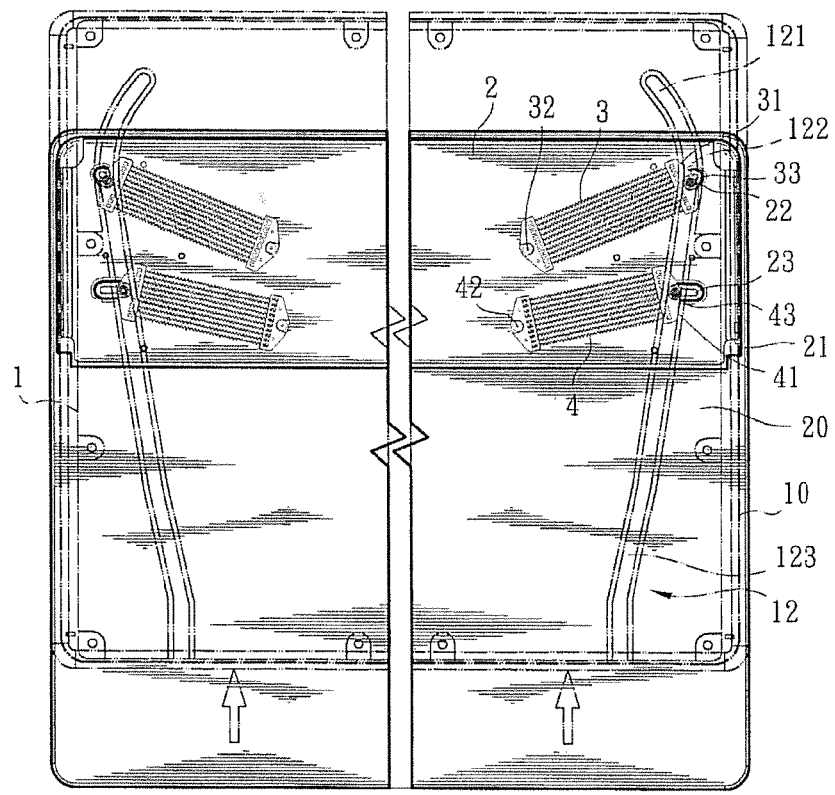
FIG. 9 is a schematic view showing the sliding cover of the first embodiment of the present invention in another opening process.
Figure 10:
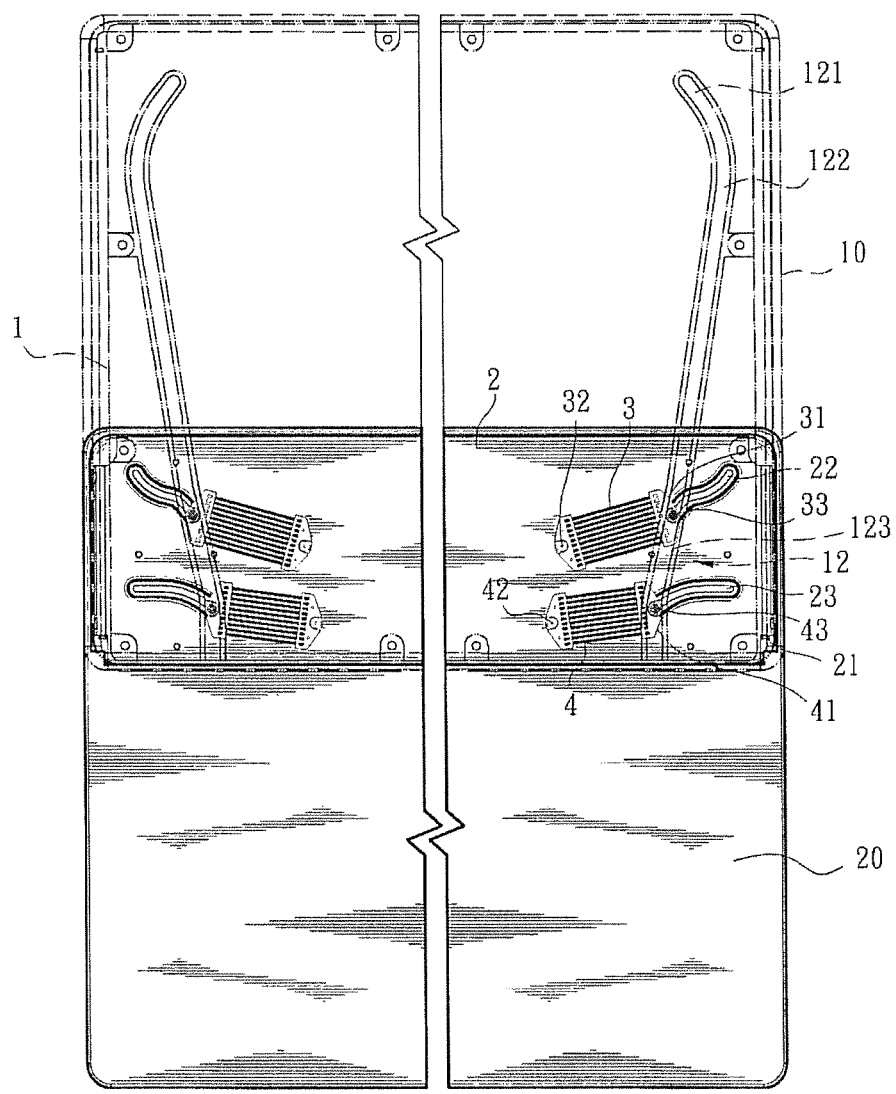
FIG. 10 is a schematic view showing the sliding cover of the first embodiment of the present invention in further another opening process.

Referring to FIGS. 8, 9, 10, 11 and 12, the operation of the first embodiment of the present invention is illustrated. As shown in FIG. 8, when the body 20 is fully covered by the sliding cover 10 thereof and the sliding member 1 is located at an initial position at one end of the relative sliding member 2, the sliding-guided element 33 of the first end 31 of the first elastic assembly 3 is located at the end portion of the first section 121 of the first sliding-guided portion 12 which is distant from the curved portion 122 thereof, the extended portion 331 of the sliding-guided element 33 of the first elastic assembly 3 is located at the middle section of the second sliding-guided portion 22 of the relative sliding member 2, the sliding-guided element 43 of the third end 41 of the second elastic assembly 4 is located at the apex of the curved portion 122 of the first sliding-guided portion 12 of the sliding member 1, and the extended portion 431 of the sliding-guided element 43 is located in the third sliding-guided portion 23 of the relative sliding member 2 which is near the end portion of the first sliding-guided portion 12 of the sliding member 1.

When the sliding cover 10 is forced to slidably move for opening (shown in FIG. 9), the sliding-guided element 33 of the first elastic assembly 3 is slidably moved from the end portion of the first sliding-guided portion 12 toward the curved portion 122 thereof, and the extended portion 331 of the sliding-guided element 33 of the first elastic assembly 3 is slidably moved from the middle section of the second sliding-guided portion 22 of the relative sliding member 2 toward the end portion thereof, such that the first elastic assembly 3 is tensioned and situated in an energy storage condition. Meanwhile, the sliding-guided element 43 of the second elastic assembly 4 is slidably moved from the apex of the curved portion 122 of the first sliding-guided portion 12 of the sliding member 1 toward the second section 123 thereof, and the extended portion 431 of the sliding-guided element 43 is slidably moved from the end portion of the third sliding-guided portion 23 of the relative sliding member 2 toward the middle section thereof, such that the second elastic assembly 4 is compressed and situated in an energy-releasing condition. Thus, an acting force applied on the sliding member 1 (the sliding cover 10) by the second elastic assembly 4 is cancelled out by a force required to tension the first elastic assembly 3, such that the applied force for driving the opening process of the sliding member 1 (the sliding cover 10) can be efficiently and economically reduced.

When the sliding cover 10 is continued to slidably move for opening, the sliding-guided element 33 of the first elastic assembly 3 and the sliding-guided element 43 of the second elastic assembly 4 are respectively passed through the curved portion 122 of the first sliding-guided portion 12 to travel to the second section 123 thereof, and the extended portion 331 of the sliding-guided element 33 of the first elastic assembly 3 and the extended portion 431 of the sliding-guided element 43 of the second elastic assembly 4 are respectively and slidably moved along the second sliding-guided portion 22 and the third sliding-guided portion 23 of the relative sliding member 2 to the end portions thereof which are distant from the first sliding-guided portion 12, such that the first and second elastic assemblies 3 and 4 are compressed and situated in an energy-releasing condition. Thus, the first and second elastic assemblies 3 and 4 are capable of providing forces sufficient to continuously and slidably move the sliding cover 10 for opening until the sliding cover 10 is fully opened (shown in FIG. 10), enabling the sliding-guided element 33 of the first elastic assembly 3 and the sliding-guided element 43 of the second elastic assembly 4 simultaneously to slidably move to and end at the end portion of the second section 123 of the first sliding-guided portion 12.

Figure 11:
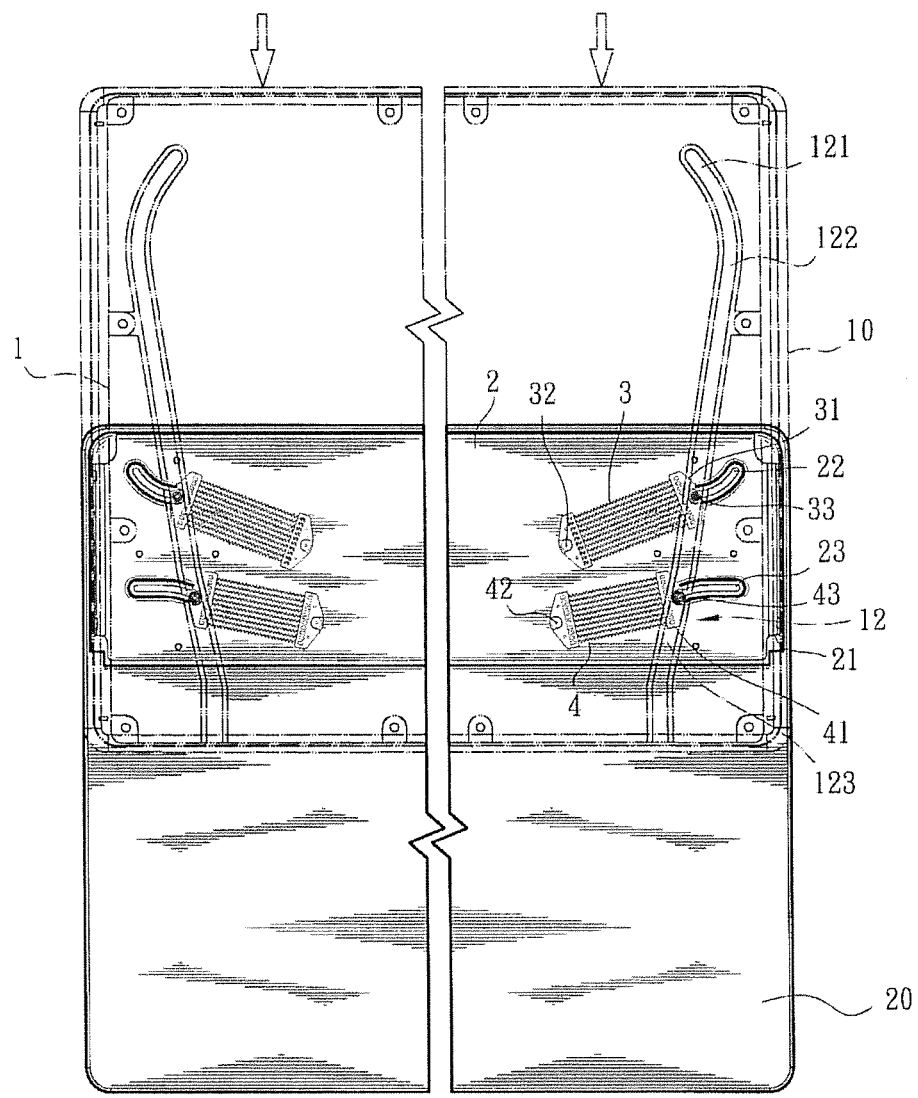
FIG. 11 is a schematic view showing the sliding cover of the first embodiment of the present invention in a closing process.

In the closing process of the sliding cover 10, when the sliding cover 10 (the sliding member 1) is acted by a reversed driving force for closing, the sliding-guided element 33 of the first elastic assembly 3 and the sliding-guided element 43 of the second elastic assembly 4 begin to slidably move toward the curved portion 122 of the first sliding-guided portion 12 along the second section 123 thereof, and the extended portion 331 of the sliding-guided element 33 of the first elastic assembly 3 and the extended portion 431 of the sliding-guided element 43 of the second elastic assembly 4 are respectively and slidably moved along the second sliding-guided portion 22 and the third sliding-guided portion 23 of the relative sliding member 2 toward the end portion thereof near the first sliding-guided portion 12 (shown in FIG. 11). At this time, because the first and second elastic assemblies 3 and 4 are situated in a tensioned condition, the user must apply a larger force, i.e., a force sufficient to overcome the acting forces of the first and second elastic assemblies 3 and 4, enabling the sliding cover 10 (the sliding member 1) to be continuously moved in the closing direction. It is noted that the main aspect of the present invention relates to the sliding cover 10 capable of being moved in a labor-saving way in the opening process, i.e., when a short part of an opening stroke of the sliding cover 10 is performed, a subsequent, long part of the opening stroke of the sliding cover 10 can be automatically operated. As to the closing process of the sliding cover 10 (the sliding member 1) requiring strenuous effort, it is actually not claimed in the scope of the appended claims of the present invention.

In the closing process of the sliding cover 10 (the sliding member 1), when the sliding-guided element 33 of the first elastic assembly 3 is slidably moved from the second section 123 of the first sliding-guided portion 12 to the apex of the curved portion 122 thereof, the extended portion 331 of the sliding-guided element 33 of the first elastic assembly 3 is also slidably moved to the end portion of the second sliding-guided portion 22 of the relative sliding member 2 which is located near the first sliding-guided portion 12. At this time, it requires a maximum driving force to slidably move the sliding cover 10, because that the first elastic assembly 3 is situated in a maximum-tensioned energy storage condition, the sliding-guided element 43 of the second elastic assembly 4 is still maintained to slidably move within the second section 123 of the first sliding-guided portion 12, and the extended portion 431 of the sliding-guided element 43 is slidably moved toward the other end portion of the third sliding-guided portion 23 (the second elastic assembly 4 is also situated in a tensioned energy storage condition).

Figure 12:
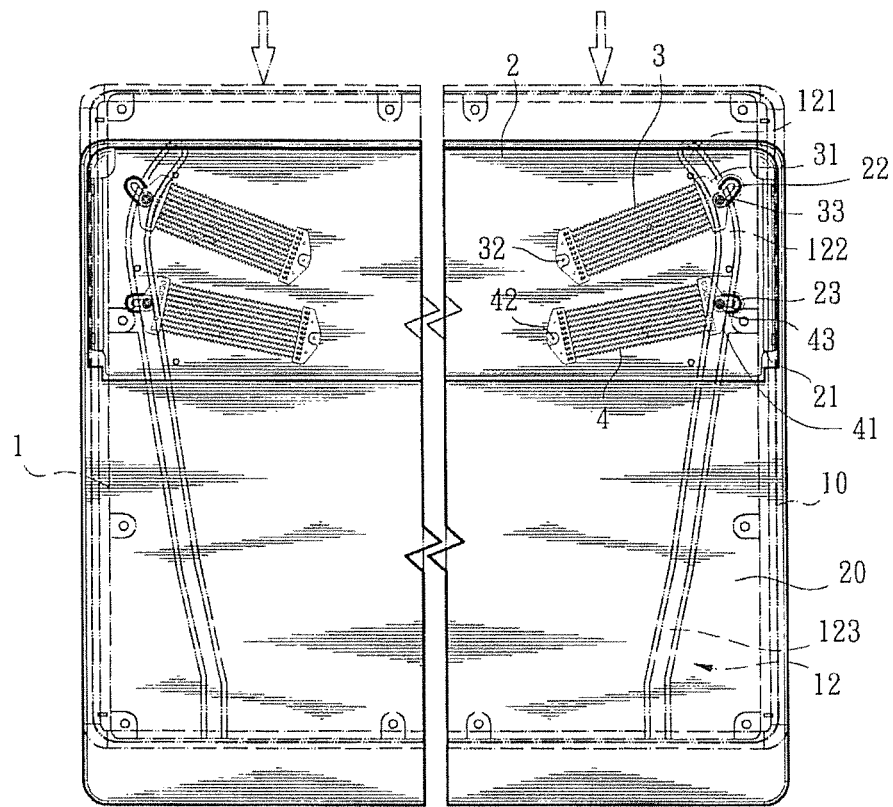
FIG. 12 is a schematic view showing the sliding cover of the first embodiment of the present invention in another closing process.

Finally, at the stroke end of the closing process of the sliding cover 10 (the sliding member 1), when the sliding-guided element 33 of the first elastic assembly 3 travels to the first section 121 of the first sliding-guided portion 12 from the curved portion 122 thereof, the extended portion 331 of the sliding-guided element 33 of the first elastic assembly 3 is slidably moved again, from the end portion of the second sliding-guided portion 22 which is located near the first sliding-guided portion 12 toward the middle section thereof, such that the first elastic assembly 3 is compressed and situated in an energy-releasing condition (shown in FIG. 12). At this time, the first elastic assembly 3 is capable of providing a force to assist in closing the sliding cover 10 and to counterbalance the applied force required to cause the second elastic assembly 4 for continuous tension and energy storage, thereby utilizing a smaller force to complete the final closing process of the sliding cover 10 (the sliding member 1).

Figure 13:
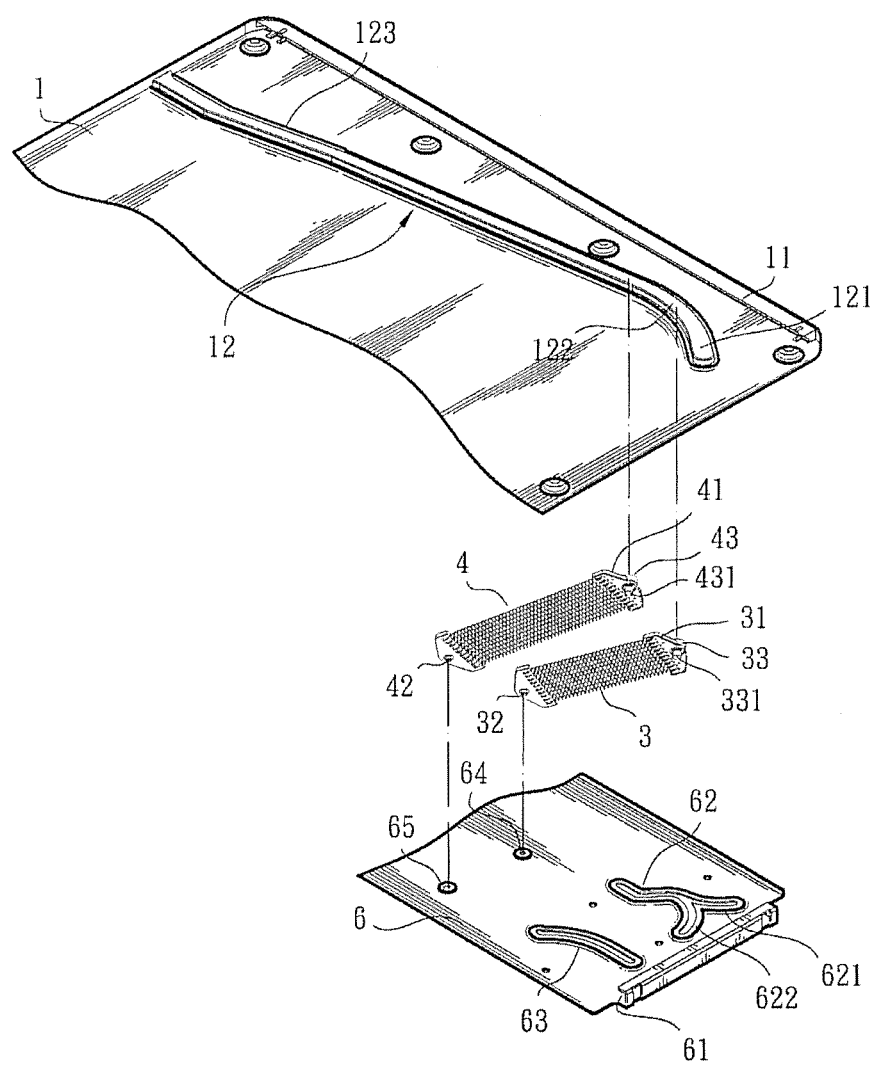
FIG. 13 is a structural exploded view of a second embodiment of the present invention.
Figure 14:
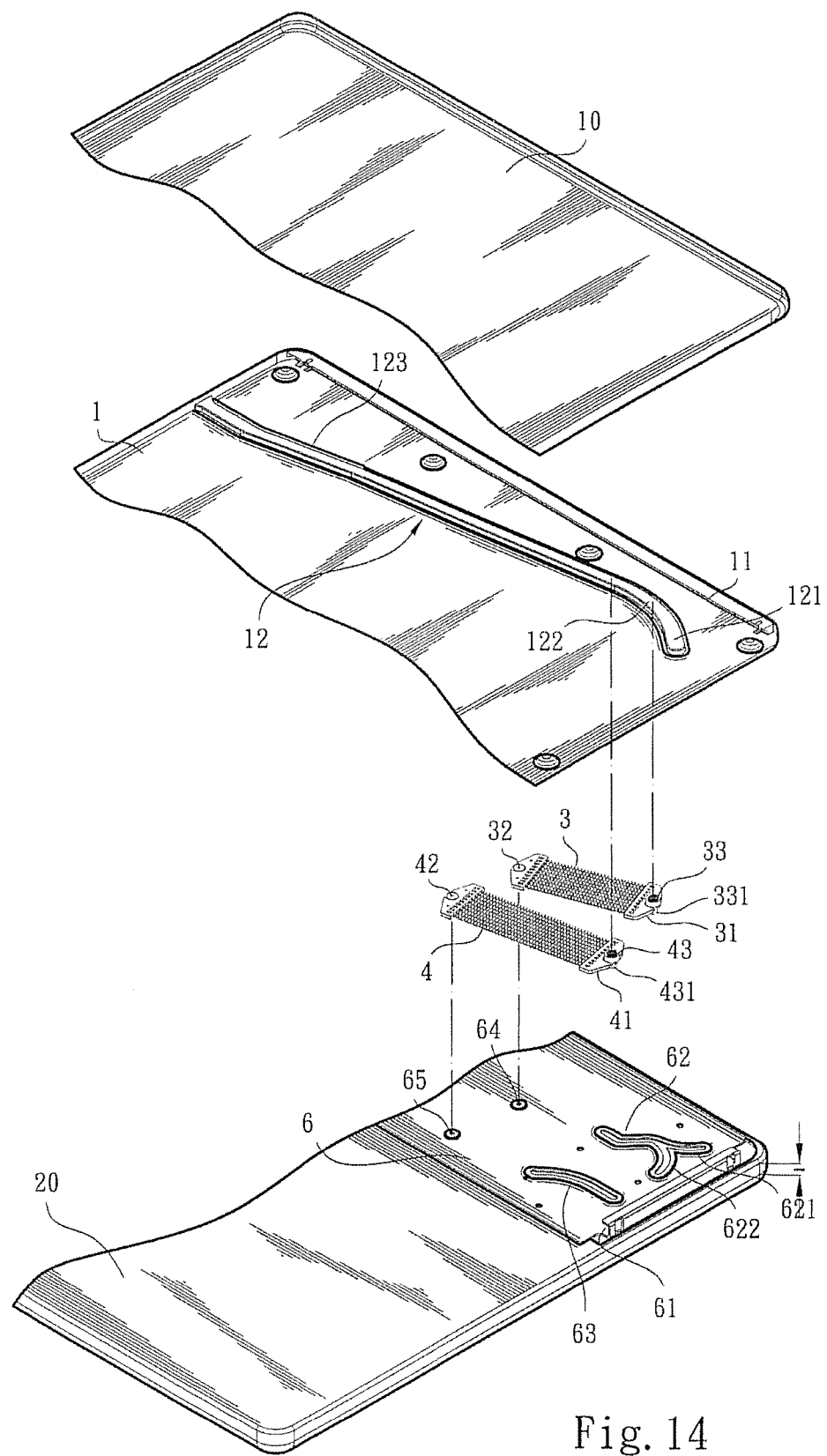
FIG. 14 is a structural exploded view of the second embodiment of the present invention together with a body and a sliding cover of an electrical device.
Figure 15:
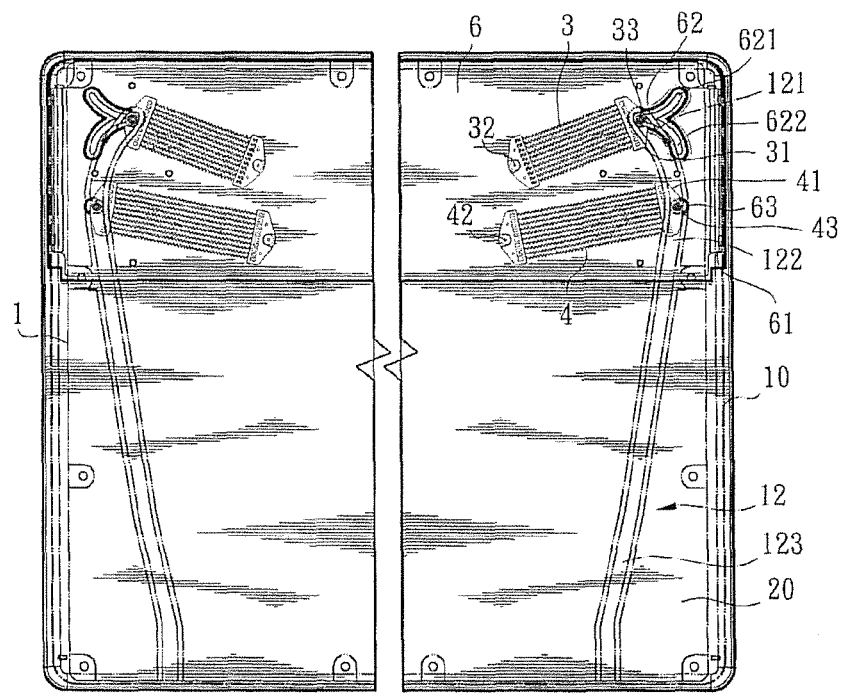
FIG. 15 is a schematic view showing the sliding cover of the second embodiment of the present invention in an opening process.
Figure 16:
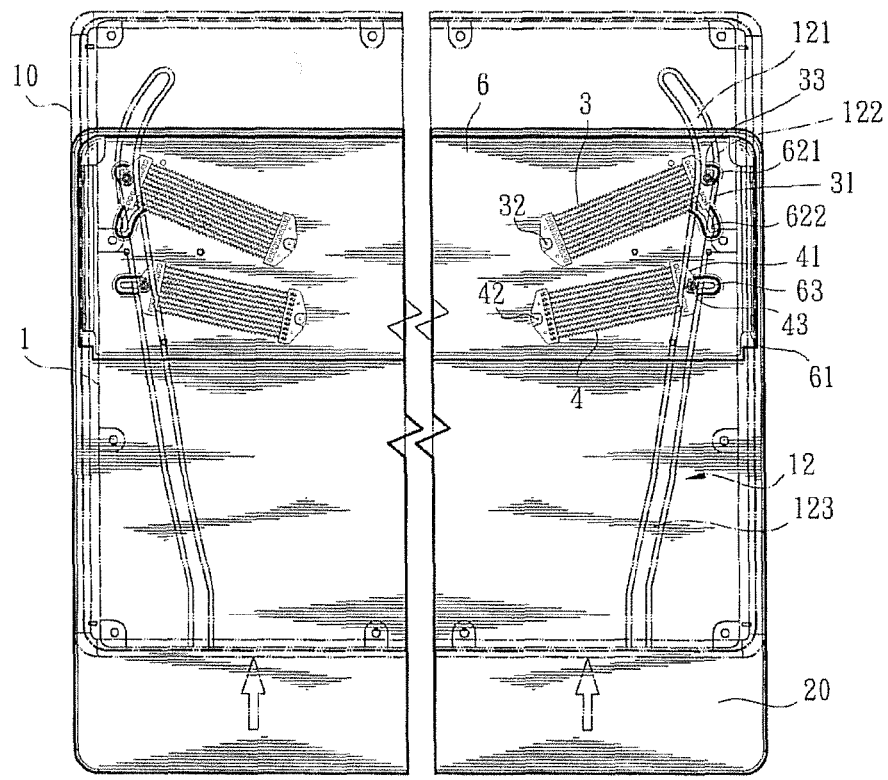
FIG. 16 is a schematic view showing the sliding cover of the second embodiment of the present invention in another opening process.
Figure 17:
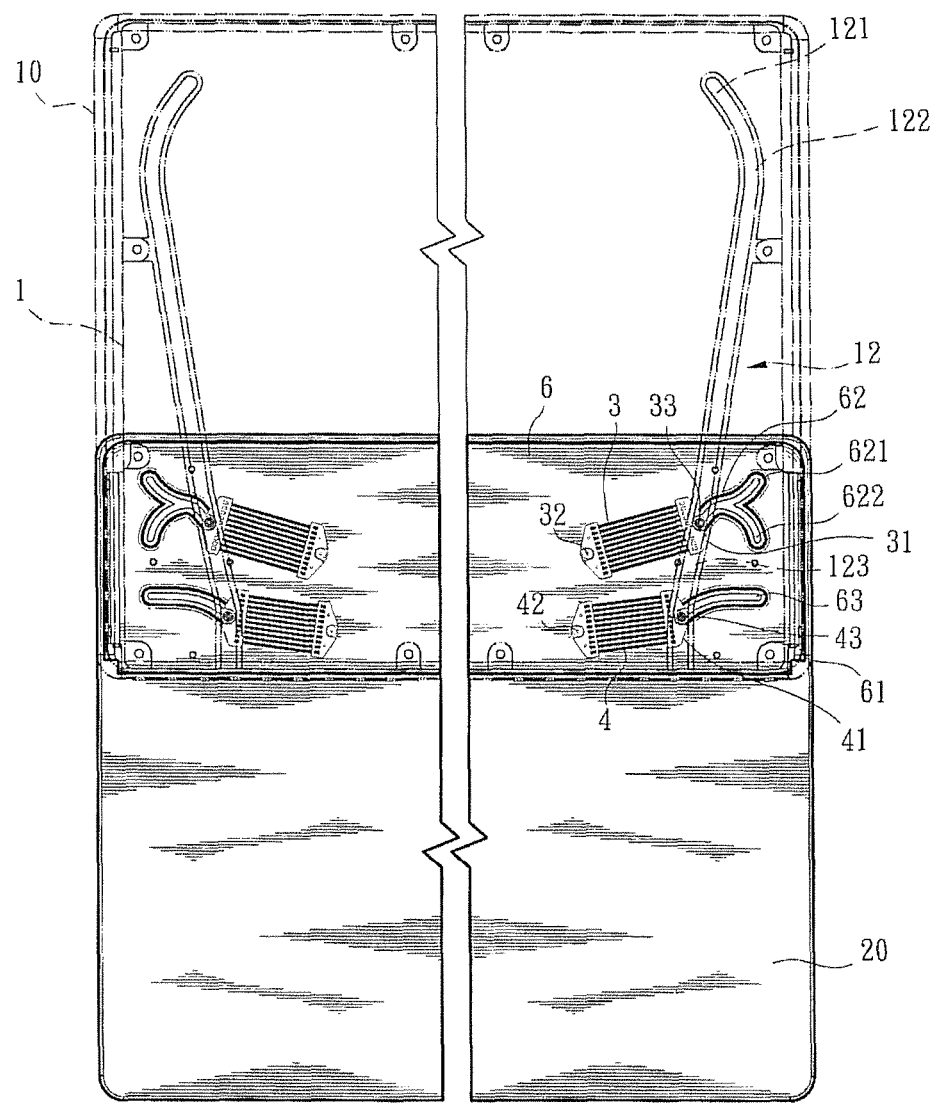
FIG. 17 is a schematic view showing the sliding cover of the second embodiment of the present invention in further another opening process.

Referring to FIGS. 13 and 14, an opening-closing guiding structure of a long-stroke sliding cover of a second embodiment of the present invention mainly comprises a relative sliding member 6, and the sliding member 1, the first elastic assembly 3 and the second elastic assembly 4 which are described in the first embodiment above. The relative sliding member 6 substantially has the same structure as the relative sliding member 2 of the first embodiment, i.e., the to-be sliding-guided portions 61, the third sliding-guided portion 63, the pivotal portion 64 and 65 of the relative sliding member 6 are fully equal to the to-be sliding-guided portions 21, the third sliding-guided portion 23, the pivotal portion 24 and 25 of the relative sliding member 2, respectively. The relative sliding member 6 differs from the relative sliding member 2 of the first embodiment in that a second sliding-guided portion 62 has a bifurcated or Y-shaped extension structure in the direction of one end portion of the first sliding-guided portion 12 of the sliding member 1. The Y-shaped extension structure of the second sliding-guided portion 62 comprises a first portion 621 and a second portion 622, wherein the first portion 621 is disposed in the direction of the closed position of the sliding cover 10, the second portion 622 is disposed in the direction of the opening position of the sliding cover 10. The extended portion 331 of the sliding-guided element 33 of the first elastic assembly 3 is slidably moved along the second sliding-guided portion 62 of the relative sliding member 6. The other components and the combination thereof in the second embodiment are the same as those in the first embodiment, thus the description on them are omitted here.

Referring to FIGS. 15, 16, 17, 18 and 19, in the operation of the second embodiment, it can be appreciated that, when the sliding cover 10 is fully covered on the body 20, the sliding member 1 is located at the initial position at one end of the relative sliding member 6 (shown in FIG. 15), the sliding-guided element 33 of the first elastic assembly 3 is located at the end portion of the first section 121 of the first sliding-guided portion 12 which is distant from the curved portion 122 thereof, the extended portion 331 of the sliding-guided element 33 of the first elastic assembly 3 travels to the middle section of the second sliding-guided portion 62 of the relative sliding member 6, the sliding-guided element 43 of the third end 41 of the second elastic assembly 4 is located at the apex of the curved portion 122 of the first sliding-guided portion 12 of the sliding member 1, and the extended portion 431 of the sliding-guided element 43 is located in the third sliding-guided portion 63 of the relative sliding member 6 which is near the end portion of the first sliding-guided portion 12 of the sliding member 1.

When the sliding cover 10 is forced to slidably move for opening (shown in FIG. 16), the sliding-guided element 33 of the first elastic assembly 3 is slidably moved from the end portion of the first sliding-guided portion 12 toward the curved portion 122 thereof, and the extended portion 331 of the sliding-guided element 33 of the first elastic assembly 3 is slidably moved from the middle section of the second sliding-guided portion 62 of the relative sliding member 6 into the first portion 621 thereof, such that the first elastic assembly 3 is tensioned and situated in an energy storage condition. Meanwhile, the extended portion 431 of the sliding-guided element 43 of the second elastic assembly 4 is slidably moved from the end portion of the third sliding-guided portion 63 of the relative sliding member 6 toward the middle section thereof, and the sliding-guided element 43 of the second elastic assembly 4 is slidably moved from the apex of the curved portion 122 of the first sliding-guided portion 12 of the sliding member 1 toward the second section 123 thereof, such that the second elastic assembly 4 is compressed and situated in an energy-releasing condition. Thus, an acting force applied on the sliding member 1 (the sliding cover 10) by the second elastic assembly 4 is cancelled out by a force required to tension the first elastic assembly 3, such that the applied force for driving the opening process of the sliding member 1 (the sliding cover 10) can be efficiently and economically reduced.

When the sliding cover 10 is continued to slidably move for opening, the sliding-guided element 33 of the first elastic assembly 3 and the sliding-guided element 43 of the second elastic assembly 4 are respectively passed through the curved portion 122 of the first sliding-guided portion 12 to travel to the second section 123 thereof, and the extended portion 331 of the sliding-guided element 33 of the first elastic assembly 3 and the extended portion 431 of the sliding-guided element 43 of the second elastic assembly 4 are respectively and slidably moved along the second sliding-guided portion 62 and the third sliding-guided portion 63 of the relative sliding member 6 to the end portions thereof which are distant from the first sliding-guided portion 12, such that the first and second elastic assemblies 3 and 4 are compressed and situated in an energy-releasing condition. Thus, the first and second elastic assemblies 3 and 4 are capable of providing forces sufficient to automatically and continuously to slidably move the sliding cover 10 for opening until the sliding cover 10 is fully opened (shown in FIG. 17).

Figure 18:
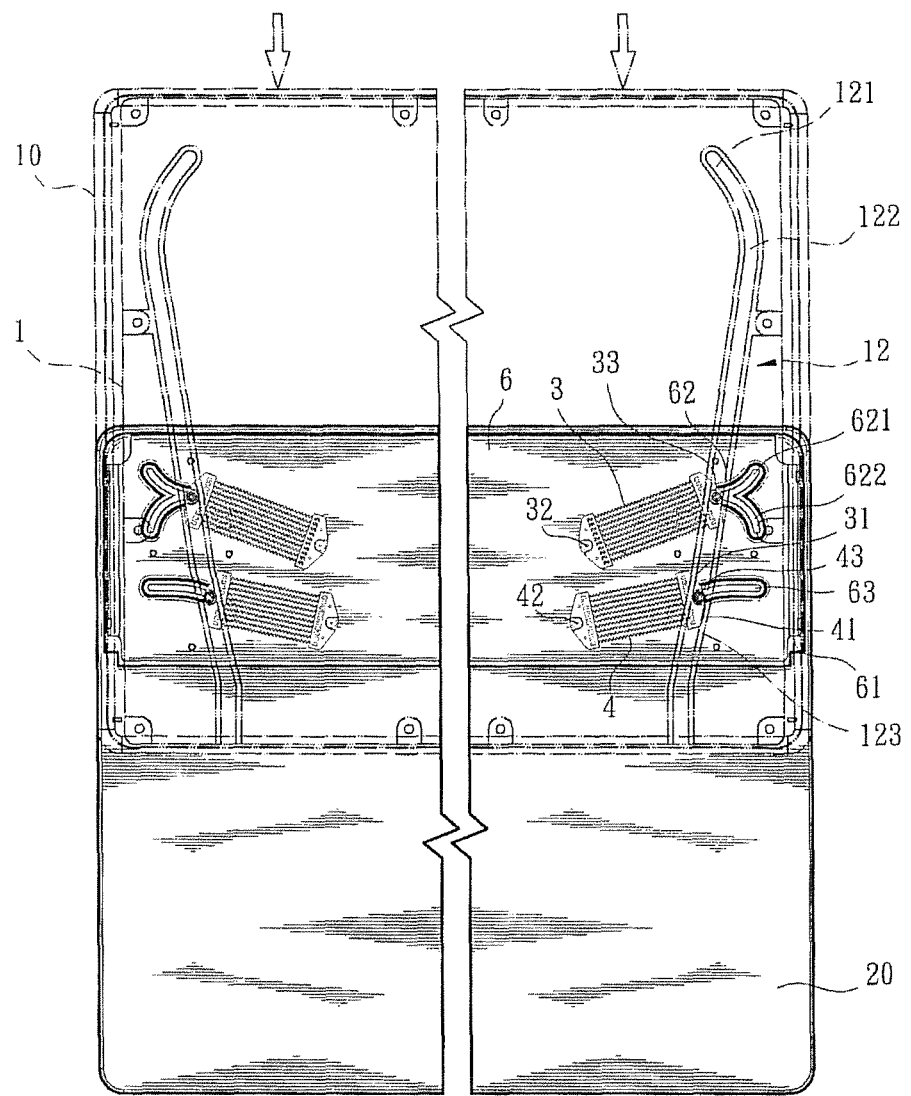
FIG. 18 is a schematic view showing the sliding cover of the second embodiment of the present invention in a closing process.

In the closing process of the sliding cover 10, when the sliding cover 10 (the sliding member 1) is acted by a reversed driving force for closing, the sliding-guided element 33 of the first elastic assembly 3 and the sliding-guided element 43 of the second elastic assembly 4 begin to slidably move toward the curved portion 122 of the first sliding-guided portion 12 along the second section 123 thereof, and the extended portion 331 of the sliding-guided element 33 of the first elastic assembly 3 and the extended portion 431 of the sliding-guided element 43 of the second elastic assembly 4 are respectively and slidably moved along the second sliding-guided portion 62 and the third sliding-guided portion 63 of the relative sliding member 6 toward the end portion thereof near the first sliding-guided portion 12 (shown in FIG. 18).

Then, when the sliding-guided element 33 of the first elastic assembly 3 is slidably moved from the second section 123 of the first sliding-guided portion 12 to the apex of the curved portion 122 thereof, the extended portion 331 of the sliding-guided element 33 of the first elastic assembly 3 is also slidably moved to the second portion 622 of the second sliding-guided portion 62 of the relative sliding member 6. At this time, it requires a maximum driving force to slidably move the sliding cover 10, because that the first elastic assembly 3 is situated in a maximum-tensioned energy storage condition, the sliding-guided element 43 of the second elastic assembly 4 is still maintained to slidably move within the second section 123 of the first sliding-guided portion 12, and the extended portion 431 of the sliding-guided element 43 is slidably moved toward the other end portion of the third sliding-guided portion 63 (the second elastic assembly 4) is also situated in a tensioned energy storage condition).

Figure 19:
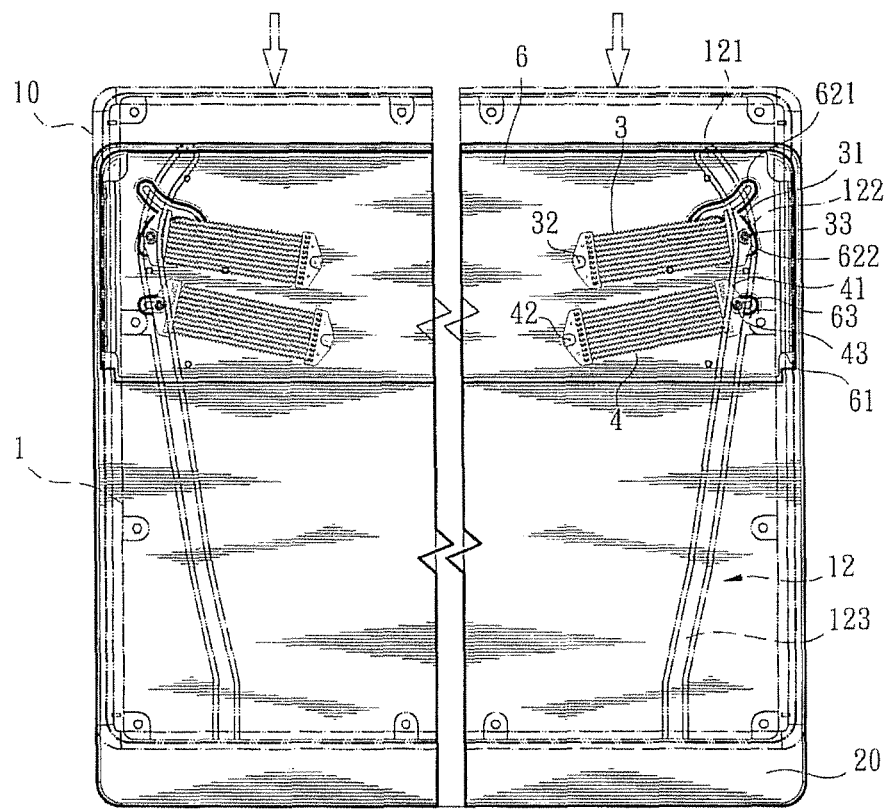
FIG. 19 is a schematic view showing the sliding cover of the second embodiment of the present invention in another closing process.

Finally, at the stroke end of the closing process of the sliding cover 10 (the sliding member 1), when the sliding-guided element 33 of the first elastic assembly 3 travels to the first section 121 of the first sliding-guided portion 12 from the curved portion 122 thereof, the extended portion 331 of the sliding-guided element 33 of the first elastic assembly 3 is slidably moved again, from the end portion of the second sliding-guided portion 62 which is located near the first sliding-guided portion 12 toward the middle section thereof, such that the first elastic assembly 3 is compressed and situated in an energy-releasing condition (shown in FIG. 19). At this time, the first elastic assembly 3 is capable of providing a force to assist in closing the sliding cover 10 and to counterbalance the applied force required to cause the second elastic assembly 4 for continuous tension and energy storage, thereby utilizing a smaller force to complete the final closing process of the sliding cover 10 (the sliding member 1).

In conclusion, with the novel and inventive opening-closing guiding structure of the long-stroke sliding cover of the present invention, it is surely to attain a labor-saving way to open the sliding cover and enables the opening sliding stroke capable of being automatically performed. While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An opening-closing guiding structure of a long-stroke sliding cover, at least comprising a sliding member and a relative sliding member which are reciprocally engaged for sliding along a preset sliding track centerline, wherein:
one of the sliding member and the relative sliding member comprises a first sliding-guided portion disposed along a sliding direction and comprising an end portion and a turned curved portion disposed near the end portion;
the other of the sliding member and the relative sliding member comprises a second sliding-guided portion and a third sliding-guided portion which are interlaced with the first sliding-guided portion and extended toward a preset guiding direction, the second sliding-guided portion having a sliding track is partially interlaced with a distal end of the first sliding-guided portion which is near the turned curved portion, and the third sliding-guided portion having a sliding track is at least partially interlaced with an inflectional apex of the turned curved portion of the first sliding-guided portion;
at least one first elastic assembly comprises one end pivotally disposed near and beside the end portion of the second sliding-guided portion and the other end slidably disposed on an interlaced site of the first sliding-guided portion and the second sliding-guided portion; and
at least one second elastic assembly comprises one end pivotally disposed beside the end portion of the third sliding-guided portion and the other end slidably disposed on an interlaced site of the first sliding-guided portion and the third sliding-guided portion.

2. The opening-closing guiding structure of the long-stroke sliding cover as claimed in claim 1, wherein the second sliding-guided portion comprises one end portion which is near the first sliding-guided portion is interlaced with the end portion of the first sliding-guided portion which is near the turned curved portion.

3. The opening-closing guiding structure of the long-stroke sliding cover as claimed in claim 2, wherein the first sliding-guided portion, the second sliding-guided portion and the third sliding-guided portion are recessed guiding slots, at least one sliding-guided element is disposed at a location where the first elastic assembly is connected to the first sliding-guided portion and the second sliding-guided portion, and at least one sliding-guided element is disposed at a location where the second elastic assembly is connected to the first sliding-guided portion and the third sliding-guided portion.

4. The opening-closing guiding structure of the long-stroke sliding cover as claimed in claim 2, wherein one of the sliding member and the relative sliding member comprises two symmetrically-arranged first sliding-guided portions, and the other of the sliding member and the relative sliding member comprises two symmetrically-arranged second sliding-guided portions and two symmetrically-arranged third sliding-guided portions.

5. The opening-closing guiding structure of the long-stroke sliding cover as claimed in claim 2, wherein the second sliding-guided portion comprises a Y-shaped extension structure.

6. The opening-closing guiding structure of the long-stroke sliding cover as claimed in claim 2, wherein the first sliding-guided portion further comprises a first section and a longer second section which are respectively located on two sides of the curved portion, and the two end portions of the first sliding-guided portion are slantly disposed in the direction of the sliding track centerline.

7. The opening-closing guiding structure of the long-stroke sliding cover as claimed in claim 2, wherein each of the sliding member and the relative sliding member comprises at least one side sliding-guided portion extended along the sliding track centerline and a to-be sliding-guided portion slidably connected to the side sliding-guided portion, and the side sliding-guided portion comprises a protruded rail and the to-be sliding-guided portion comprises a recessed slot being engaged with the protruded rail.

8. The opening-closing guiding structure of the long-stroke sliding cover as claimed in claim 2, wherein one of the sliding member and the relative sliding member is connected to a body of an electrical device, and the other of the sliding member and the relative sliding member is connected to a sliding cover of the electrical device.

9. The opening-closing guiding structure of the long-stroke sliding cover as claimed in claim 1, wherein the third sliding-guided portion comprises one end portion which is near the first sliding-guided portion is interlaced with the inflectional apex of the turned curved portion of the first sliding-guided portion.

10. The opening-closing guiding structure of the long-stroke sliding cover as claimed in claim 9, wherein the first sliding-guided portion, the second sliding-guided portion and the third sliding-guided portion are recessed guiding slots, at least one sliding-guided element is disposed at a location where the first elastic assembly is connected to the first sliding-guided portion and the second sliding-guided portion, and at least one sliding-guided element is disposed at a location where the second elastic assembly is connected to the first sliding-guided portion and the third sliding-guided portion.

11. The opening-closing guiding structure of the long-stroke sliding cover as claimed in claim 9, wherein one of the sliding member and the relative sliding member comprises two symmetrically-arranged first sliding-guided portions, and the other of the sliding member and the relative sliding member comprises two symmetrically-arranged second sliding-guided portions and two symmetrically-arranged third sliding-guided portions.

12. The opening-closing guiding structure of the long-stroke sliding cover as claimed in claim 9, wherein the second sliding-guided portion comprises a Y-shaped extension structure.

13. The opening-closing guiding structure of the long-stroke sliding cover as claimed in claim 9, wherein the first sliding-guided portion further comprises a first section and a longer second section which are respectively located on two sides of the curved portion, and the two end portions of the first sliding-guided portion are slantly disposed in the direction of the sliding track centerline.

14. The opening-closing guiding structure of the long-stroke sliding cover as claimed in claim 9, wherein each of the sliding member and the relative sliding member comprises at least one side sliding-guided portion extended along the sliding track centerline and a to-be sliding-guided portion slidably connected to the side sliding-guided portion, and the side sliding-guided portion comprises a protruded rail and the to-be sliding-guided portion comprises a recessed slot being engaged with the protruded rail.

15. The opening-closing guiding structure of the long-stroke sliding cover as claimed in claim 9, wherein one of the sliding member and the relative sliding member is connected to a body of an electrical device, and the other of the sliding member and the relative sliding member is connected to a sliding cover of the electrical device.

16. The opening-closing guiding structure of the long-stroke sliding cover as claimed in claim 1, wherein the first sliding-guided portion, the second sliding-guided portion and the third sliding-guided portion are recessed guiding slots, at least one sliding-guided element is disposed at a location where the first elastic assembly is connected to the first sliding-guided portion and the second sliding-guided portion, and at least one sliding-guided element is disposed at a location where the second elastic assembly is connected to the first sliding-guided portion and the third sliding-guided portion.

17. The opening-closing guiding structure of the long-stroke sliding cover as claimed in claim 16, wherein the sliding-guided element of the first elastic assembly comprises a roller which is enters into an interior of one of the first sliding-guided portion and the second sliding-guided portion.

18. The opening-closing guiding structure of the long-stroke sliding cover as claimed in claim 17, wherein the roller comprises an axial portion protruded with an extended portion which enters into an interior of the other of the first sliding-guided portion and the second sliding-guided portion.

19. The opening-closing guiding structure of the long-stroke sliding cover as claimed in claim 16, wherein the sliding-guided element of the second elastic assembly comprises a roller which enters into an interior of one of the first sliding-guided portion and the third sliding-guided portion.

20. The opening-closing guiding structure of the long-stroke sliding cover as claimed in claim 19, wherein the roller comprises an axial portion protruded with an extended portion which enters into an interior of the other of the first sliding-guided portion and the third sliding-guided portion.

21. The opening-closing guiding structure of the long-stroke sliding cover as claimed in claim 16, wherein one of the sliding member and the relative sliding member comprises two symmetrically-arranged first sliding-guided portions, and the other of the sliding member and the relative sliding member comprises two symmetrically-arranged second sliding-guided portions and two symmetrically-arranged third sliding-guided portions.

22. The opening-closing guiding structure of the long-stroke sliding cover as claimed in claim 16, wherein the second sliding-guided portion comprises a Y-shaped extension structure.

23. The opening-closing guiding structure of the long-stroke sliding cover as claimed in claim 16, wherein the first sliding-guided portion further comprises a first section and a longer second section which are respectively located on two sides of the curved portion, and the two end portions of the first sliding-guided portion are slantly disposed in the direction of the sliding track centerline.

24. The opening-closing guiding structure of the long-stroke sliding cover as claimed in claim 16, wherein each of the sliding member and the relative sliding member comprises at least one side sliding-guided portion extended along the sliding track centerline and a to-be sliding-guided portion slidably connected to the side sliding-guided portion, and the side sliding-guided portion comprises a protruded rail and the to-be sliding-guided portion comprises a recessed slot being engaged with the protruded rail.

25. The opening-closing guiding structure of the long-stroke sliding cover as claimed in claim 16, wherein one of the sliding member and the relative sliding member is connected to a body of an electrical device, and the other of the sliding member and the relative sliding member is connected to a sliding cover of the electrical device.

26. The opening-closing guiding structure of the long-stroke sliding cover as claimed in claim 1, wherein one of the sliding member and the relative sliding member comprises two symmetrically-arranged first sliding-guided portions, and the other of the sliding member and the relative sliding member comprises two symmetrically-arranged second sliding-guided portions and two symmetrically-arranged third sliding-guided portions.

27. The opening-closing guiding structure of the long-stroke sliding cover as claimed in claim 26, wherein each of the sliding member and the relative sliding member comprises at least one side sliding-guided portion extended along the sliding track centerline and a to-be sliding-guided portion slidably connected to the side sliding-guided portion, and the side sliding-guided portion comprises a protruded rail and the to-be sliding-guided portion comprises a recessed slot being engaged with the protruded rail.

28. The opening-closing guiding structure of the long-stroke sliding cover as claimed in claim 1, wherein the second sliding-guided portion comprises a Y-shaped extension structure.

29. The opening-closing guiding structure of the long-stroke sliding cover as claimed in claim 28, wherein each of the sliding member and the relative sliding member comprises at least one side sliding-guided portion extended along the sliding track centerline and a to-be sliding-guided portion slidably connected to the side sliding-guided portion, and the side sliding-guided portion comprises a protruded rail and the to-be sliding-guided portion comprises a recessed slot being engaged with the protruded rail.

30. The opening-closing guiding structure of the long-stroke sliding cover as claimed in claim 1, wherein the first sliding-guided portion further comprises a first section and a longer second section which are respectively located on two sides of the curved portion, and the two end portions of the first sliding-guided portion are slantly disposed in the direction of the sliding track centerline.

31. The opening-closing guiding structure of the long-stroke sliding cover as claimed in claim 1, wherein each of the sliding member and the relative sliding member comprises at least one side sliding-guided portion extended along the sliding track centerline and a to-be sliding-guided portion slidably connected to the side sliding-guided portion, and the side sliding-guided portion comprises a protruded rail and the to-be sliding-guided portion comprises a recessed slot being engaged with the protruded rail.

32. The opening-closing guiding structure of the long-stroke sliding cover as claimed in claim 1, wherein one of the sliding member and the relative sliding member is connected to a body of an electrical device, and the other of the sliding member and the relative sliding member is connected to a sliding cover of the electrical device.

\* \* \* \* \*